United States Patent [19]
Kirkpatrick

[11] Patent Number: 5,855,967
[45] Date of Patent: Jan. 5, 1999

[54] METHOD OF PROTECTING SURFACES ON DIAMOND, DIAMONDLIKE CARBON OR CARBON

[75] Inventor: Allen R. Kirkpatrick, Lexington, Mass.

[73] Assignee: Epion Corporation, Bedford, Mass.

[21] Appl. No.: 959,114

[22] Filed: Oct. 23, 1997

Related U.S. Application Data

[63] Continuation of Ser. No. 564,477, Nov. 29, 1995, abandoned.

[51] Int. Cl.$^6$ .................................................. C23C 14/14
[52] U.S. Cl. ........................ 427/527; 427/113; 427/122; 427/249; 427/255.4; 427/372.2; 427/376.1; 427/397.1; 427/399; 427/523; 427/526; 427/530; 427/531
[58] Field of Search .................................. 427/526, 527, 427/530, 531, 397.1, 376.1, 372.2, 249, 255.4, 399, 113, 122, 523

[56] References Cited

U.S. PATENT DOCUMENTS

| | | | |
|---|---|---|---|
| 4,296,144 | 10/1981 | Maby et al. | 427/531 X |
| 5,306,529 | 4/1994 | Nishimura | 427/530 X |
| 5,385,762 | 1/1995 | Prins | 427/530 X |

*Primary Examiner*—Bernard Pianalto
*Attorney, Agent, or Firm*—Brian M. Dingman

[57] ABSTRACT

This invention concerns a method for protecting surfaces of diamond, diamondlike carbon and of other forms of carbon, from the effects of oxidation which can occur at high temperatures in an oxidizing environment. The method involves exposing the surface of the diamond or other carbon material to energetic ions of, or containing, an element or elements which can be caused to react with the carbon to form a thin layer containing a carbide compound that is itself more oxidation resistant than the diamond or other carbon material and which is able to serve as a barrier to prevent or delay penetration of oxygen to the thereby protected diamond or other carbon material.

13 Claims, 7 Drawing Sheets

METHOD OF PROTECTING SURFACES ON DIAMOND, DIAMONDLIKE CARBON OR CARBON

This application is a continuation of application Ser. No. 08/564,477, filed on Nov. 29, 1995, now abandoned.

GOVERNMENT RIGHTS

The U.S. Government has the right to a paid-up license in this invention as provided in the terms of Contract No. N60921-93-C-0116.

FIELD OF INVENTION

This invention relates to a method for protecting a surface on diamond, diamondlike carbon, or other carbon material against oxidation occurring at elevated temperatures by implanting into the surface energetic ions of a species able to react with carbon to form a carbide, and to the oxidation-resistant diamond, diamondlike carbon or other carbon material.

BACKGROUND OF THE INVENTION

The element carbon exists in many forms as a bulk material or as deposited films and coatings. Examples include natural diamond and graphite and various forms of diamond and graphite, diamondlike carbon and hard amorphous carbon produced by various vapor deposition processes. A common characteristic of the different forms of elemental carbon is a susceptibility to oxidation at temperatures above approximately 500° C. This susceptibility to oxidation at elevated temperatures is generally a disadvantage which restricts the usefulness of these materials.

Natural diamond and diamond coatings and sheets produced by vapor deposition processes are candidates for applications which can utilize the outstanding combination of mechanical, thermal and optical properties they exhibit. Although diamond is almost chemically inert at low temperatures, it is subject to oxidation at temperatures above approximately 500° C. Oxidation reactions on diamond surfaces generate volatile CO or $CO_2$ gas and lead to surface erosion and other forms of surface deterioration. The susceptibility to elevated temperature oxidation restricts the use of diamond in some applications where the characteristics of diamond could otherwise be advantageously employed.

As an example, because of its excellent mechanical properties, thermal conductivity, thermal shock resistance and optical characteristics, polycrystalline diamond grown by chemical vapor deposition is considered to be a candidate for use as infrared windows or radomes of high-speed missiles. The diamond might be used to form the window or radome structure or might be employed as a coating over a base of other materials such as germanium, zinc sulfide or zinc selenide. Under some circumstances, the diamond surface of an infrared window or radome of a high-speed missile might reach temperatures in excess of 1000° C. for brief periods during atmospheric flight. The diamond would then be subject to rapid oxidation and associated degradation of its physical and optical properties unless an effective barrier against oxidation were to be provided. Prior attempts have been made to develop suitable oxidation protection by depositing optical coatings of oxidation-resistant materials such as hafnium oxide or yttrium oxide over the diamond. However, due to the inert nature of diamond and to effects such as different rates of thermal expansion of diamond and the coating materials, the deposited coatings have tended to delaminate at elevated temperatures, which is unacceptable. Thin intermediate layers of silicon carbide deposited on the surface of the diamond by sputtering have been used to improve the adhesion of the oxidation protection coatings to the diamond, but the coatings still fail by delamination at unacceptably low temperatures.

SUMMARY OF THE INVENTION

It is therefore an object of this invention to provide a method of protecting diamond, diamondlike carbon and other forms of carbon from oxidation at elevated temperatures.

It is a further object of this invention to provide such a method which does not rely on a deposited surface coating for protection of the diamond, diamondlike carbon and other forms of carbon from oxidation at elevated temperatures.

It is a further object of this invention to provide a method for elevated temperature oxidation protection of the diamond, diamondlike carbon and other forms of carbon which relies upon reactive transformation of a shallow region near the surface of the carbon material into a carbide compound which is resistant to oxidation at elevated temperatures and can act as a barrier to block or delay penetration by oxygen.

It is a further object of this invention to provide such a method which does not suffer from delamination failure at elevated temperatures.

It is a further object of this invention to provide a method for protecting diamond, diamondlike carbon and other forms of carbon from oxidation for prolonged periods at temperatures moderately higher than 500° C.

It is a further object of this invention to provide a method for protecting diamond, diamondlike carbon and other forms of carbon from oxidation for brief periods at temperatures up to 1400° C. or higher.

It is a further object of this invention to provide a method for protecting diamond and diamondlike carbon from oxidation at elevated temperatures while retaining most of the initial optical transmittance of these materials in the ultraviolet, visible and infrared regions of the electromagnetic spectrum.

It is a further object of this invention to provide a method for protecting diamond, diamondlike carbon and other forms of carbon from oxidation at elevated temperatures without excessive deterioration of the desirable mechanical, thermal and chemical characteristics of these materials.

It is a further object of this invention to provide a method for preparing an adherent adhesion-enhancing interface layer on surfaces of diamond, diamondlike carbon or other carbon materials which will allow subsequently deposited coatings of other materials to adhere more reliably to these surfaces.

This invention results from the realization that single crystal natural diamond and polycrystalline vapor deposited diamond can be protected from oxidation occurring at high temperatures by ion implanting a carbide-forming species such as silicon into the diamond to create an integral surface layer of carbide material that is more oxidation resistant than diamond.

This invention features methods of protecting diamond, diamondlike carbon and other forms of carbon from high-temperature oxidation, and also features oxidation-resistant products of these materials. The protection is produced by subjecting the surface of the diamond, diamondlike carbon or other carbon material to energetic ions of a species which will react with the carbon to form a carbide compound that is more oxidation resistant than the starting material. The material is heated during and/or after the ion treatment to react the ions with the carbon to form the oxidation-resistant carbide compound within the vicinity of the surface of the material.

The ion treatment may be accomplished by ion implantation at an ion energy of a few hundred eV up to 10 MeV with an ion dose of from $10^{15}$ to $10^{19}$ ions per square centimeter. The preferred ranges are between 1 keV and 400 keV with an ion dose of $10^{16}$ to $3\times10^{18}$ ions per square centimeter. The treatment should be accomplished with the diamond, diamondlike carbon or other carbon material at a temperature between ambient temperature and 1500° C. during ion implantation. The preferred treatment uses a temperature of at least 400° C. during and/or following ion implantation.

The material to be ion implanted is one which is able to react with carbon to form a carbide. In the preferred embodiment, the implanted material is silicon. This forms a silicon carbide layer that reduces IR transmission at about 700 to 900 $cm^{-1}$. Other implantable, carbide-forming materials include aluminum, chromium, gadolinium, hafnium, uranium, titanium, tantalum, tungsten, zirconium, vanadium, molybdenum, niobium and boron.

Also featured in this invention is an oxidation-resistant diamond, diamondlike carbon or other carbon material item. The item includes an implanted layer of an oxidation-resistant material such as silicon carbide or another carbide. The concentration of the implanted ion species at its maximum level is preferably, but not necessarily, at least 10 percent of the concentration of the material in the stoichiometric carbide.

This invention also features methods of producing a diamond, diamondlike carbon or other form of carbon with a surface layer that enhances the adhesion of subsequently deposited coatings of other materials such as oxides of refractory metals that may be desirable to deposit on the surface of the item. Such adhesion-enhanced items are also featured in this invention.

BRIEF DESCRIPTION OF THE DRAWINGS

Other objects, features and advantages will occur to those skilled in the art from the following description of preferred embodiments, and the accompanying drawings, in which.

DISCLOSURE OF THE PREFERRED EMBODIMENTS

This invention may be accomplished in a method of protecting diamond, diamondlike carbon or other carbon material by exposing the diamond, diamondlike carbon or other carbon material to energetic ions of a material that reacts with carbon to form a compound that is more oxidation-resistant than the diamond, diamondlike carbon or other carbon material. During this ion exposure and/or afterwards, the diamond, diamondlike carbon or other carbon material is heated to chemically react the ions with the carbon atoms to form a carbide compound in a surface layer of the diamond, diamondlike carbon or other carbon material for oxidation-protecting the diamond, diamondlike carbon or other carbon material. The preferred method of ion exposure is ion implantation to create the layer of oxidation-resistant material.

The materials that can be provided as ions to the diamond, diamondlike carbon or other carbon material for accomplishing this stated purpose include, but are not limited to, silicon, titanium, tantalum, tungsten, zirconium, vanadium, molybdenum, niobium, aluminum, chromium, gadolinium, hafnium, uranium, and boron.

Figure 1:
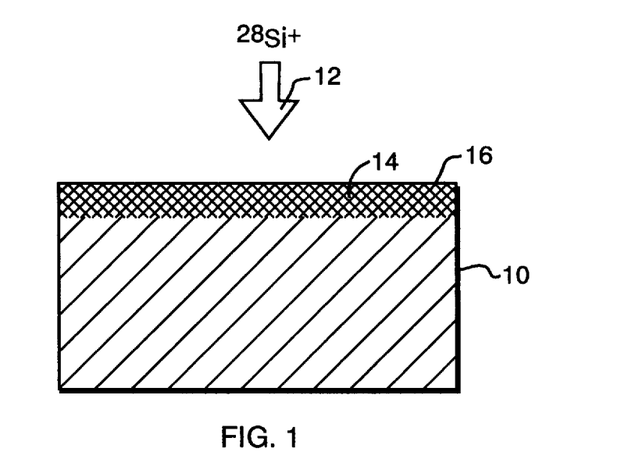
FIG. 1 is a schematic cross sectional representation of a diamond or diamondlike carbon or other carbon item being implanted by the preferred embodiment of the method of this invention.

There is shown in FIG. 1 diamond, diamondlike carbon or other carbon material item 10 according to this invention, which may also be oxidation-protected by the method of this invention. Item 10 may be a natural or man-made diamond, a diamondlike carbon material, or other carbon material, or a diamond coating, diamondlike carbon coating or other carbon material coating on a different substrate, not shown. Item 10 is exposed to ions 12 of a material such as silicon that is able to chemically react with carbon to form a carbide compound that is more oxidation-resistant than the diamond, diamondlike carbon or other carbon material 10. As explained below, ions 12 are preferably implanted into item 10 using an ion implantation apparatus of the type known in the art, but might also be introduced by other types of energetic ion process equipment that provide energetic ions of the correct material to the surface to be protected, such as plasma immersion apparatus or beam ion source apparatus. Item 10 is heated during and/or after the ion treatment to react the ions with the carbon to form the oxidation-resistant compound. The result is formation of a layer 14 which is on the surface or buried just below surface 16 of item 10. Layer 14 increases the resistance on surface 16 of item 10 to oxidation. Each face of item 10 which is to be subjected to oxidizing conditions may be treated in this manner in order to provide the desired degree of protection for item 10.

Figure 2:
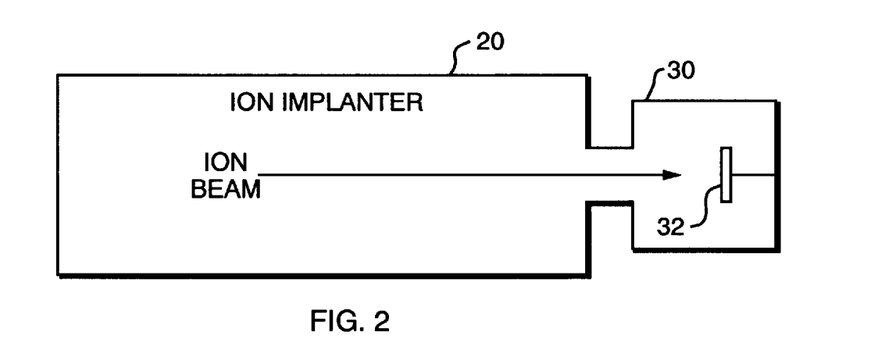
FIG. 2 is a highly schematic diagram of an ion implantation apparatus for performing the preferred embodiment of the method of this invention.

A very simplified schematic diagram of an ion implantation apparatus which may be used to accomplish the methods of this invention, and to fabricate the oxidation-protected items of this invention, is shown in FIG. 2. The apparatus includes an ion implanter 20 which may be a commercial semiconductor ion implantation system available from Varian Extrion Division of Gloucester, Mass. The implantation system may be modified by placing a heating system, such as oven 30, at the end where the item to be implanted is to be processed. Oven 30 can be used to heat diamond wafer 32 to a temperature which is sufficient to cause the implanted ions to chemically react with the carbon to form the oxidation-resistant carbide compound. Alternatively, item 32 could be implanted without additional heating, which is a more typical ion implantation process, and then post-annealed at a temperature sufficient to cause chemical reaction of the implanted ions with the carbon.

The material selected for ionization and reaction with the carbon is preferably a material that is implantable in the carbon and that reacts with carbon to form a carbide that is more oxidation resistant than the starting material. Such materials include silicon, titanium, tantalum, tungsten, vanadium, aluminum, chromium, gadolinium, hafnium, niobium, uranium, zirconium, molybdenum and boron. The process will be described herein in relation to implantation of silicon ions and the formation of silicon carbide, which offers excellent properties for the role of a protective surface layer. Silicon carbide does not melt or sublime below 2700° C. and is chemically nonreactive and is virtually inert against oxidation at temperatures below about 1000° C. Even at temperatures above 1000° C., it reacts with oxygen relatively slowly and can serve as a barrier against penetration by oxygen. Silicon carbide is extremely hard and has high thermal conductivity, properties of possible importance for protective coating layers on diamond, diamondlike carbon and other carbon materials.

Figure 3:
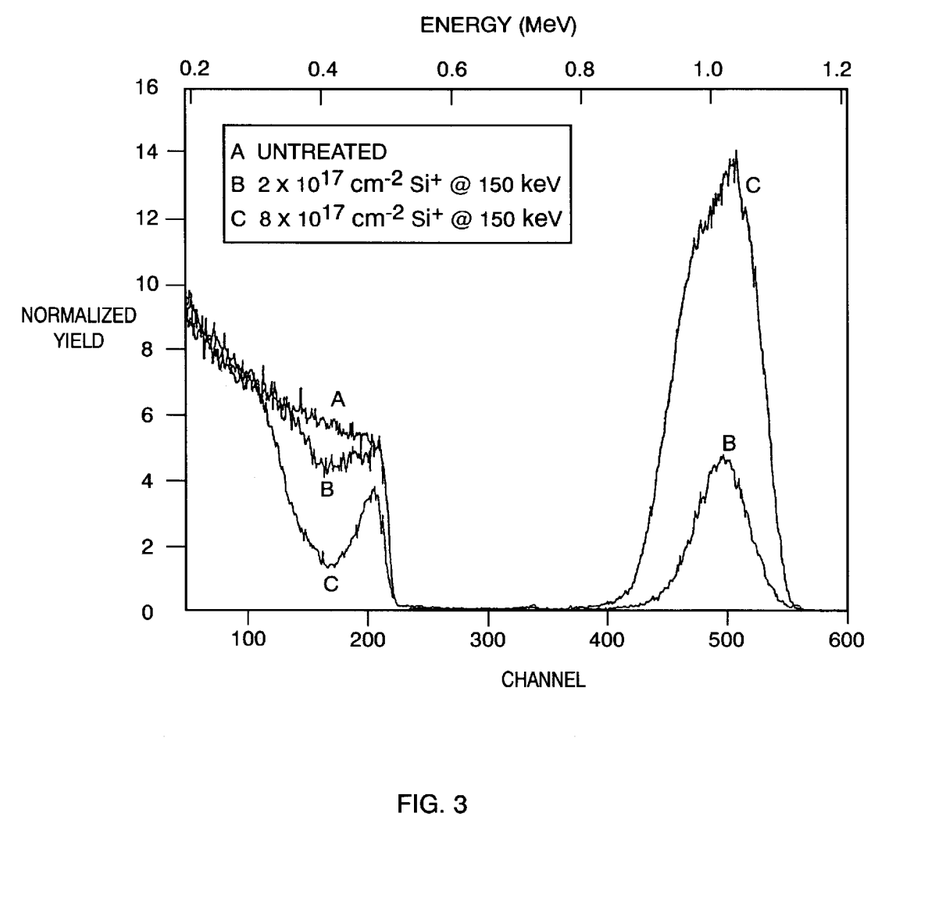
FIG. 3 shows Rutherford backscattering spectra from natural diamond samples implanted by silicon ions using the preferred ion implantation method of this invention, also illustrating the implanted item of this invention.

The integral layer formed within diamond or another form of carbon by implantation of silicon ions is $SiC_x$, with a varying Si/C ratio determined by the final distribution of the implanted silicon ions. An effective oxidation-protection layer can exist over a wide range of Si/C ratios. Preferably, at its maximum, the silicon concentration within the implanted layer is a concentration of at least about 10% of the concentration of silicon in stoichiometric silicon carbide. The implanted ion concentration needs to be sufficient for the end-use of the oxidation protected item. It has been experimentally determined that maximum silicon concentrations of about 15% are effective as depicted in FIG. 3. It is theorized that at some lower limit, the carbide molecules will be too dispersed to be effective, depending of course on the product requirements.

The thickness of the implanted layer is determined by the silicon ion energy, which can be from a few hundred eV up to 10 MeV. The lower limit will form about a monolayer of implanted ions, while the upper limit is determined by the highest energy implant equipment currently available. The preferred range of silicon ion energies is between about 1 keV, effective to form implanted layers of a few atoms thickness, and 400 keV, the upper limit of commercially-available implant equipment. Within this range, the created protective silicon carbide layer will have a thickness of less than 0.5 microns, which is sufficient to protect the diamond from oxidation under most circumstances. For example, an integral reactively formed silicon carbide layer of thickness 0.1 micron or less is expected to be sufficient to protect diamond windows and radomes of advanced high-speed missiles at the maximum temperatures which will be reached by the windows and radomes for durations longer than the durations of flight of such missiles through atmosphere.

The silicon ion dose required under such conditions to produce implanted layers having the desired amount of silicon fall in the range of about $10^{15}$ to $10^{19}$ ions per square centimeter. More specifically, the preferred ranges are between about 1 keV and 400 keV with a total ion dose of about $10^{16}$ to $3 \times 10^{18}$ ions per square centimeter. The lower end is sufficient to establish a peak low-energy implanted ion concentration of a few percent of stoichiometric, while the upper end is the practical sputtering saturation limit for materials such as silicon. The temperature during ion implantation may range from room temperature up to virtually any temperature that the diamond, diamondlike carbon or other carbon material can withstand. It has been found that temperatures of 400° C. to higher than 1000° C. provide proper conditions for accomplishing chemical reaction of implanted silicon ions with diamond.

FIG. 3 shows graphs of Rutherford backscattering spectra of helium ions from an unimplanted natural diamond sample (line A), from a similar diamond sample implanted with $2 \times 10^{17}$ silicon ions per square centimeter at 150 keV and 975° C. (line B), and another similar diamond sample implanted with $8 \times 10^{17}$ silicon ions per square centimeter at 150 keV and 975° C. (line C). These graphed spectra provide information which indicates the distributions of the implanted silicon atoms within the processed diamond surfaces based upon knowledge of the physics of the backscattering interactions of high energy helium ions with atoms of solid materials.

Figure 4:
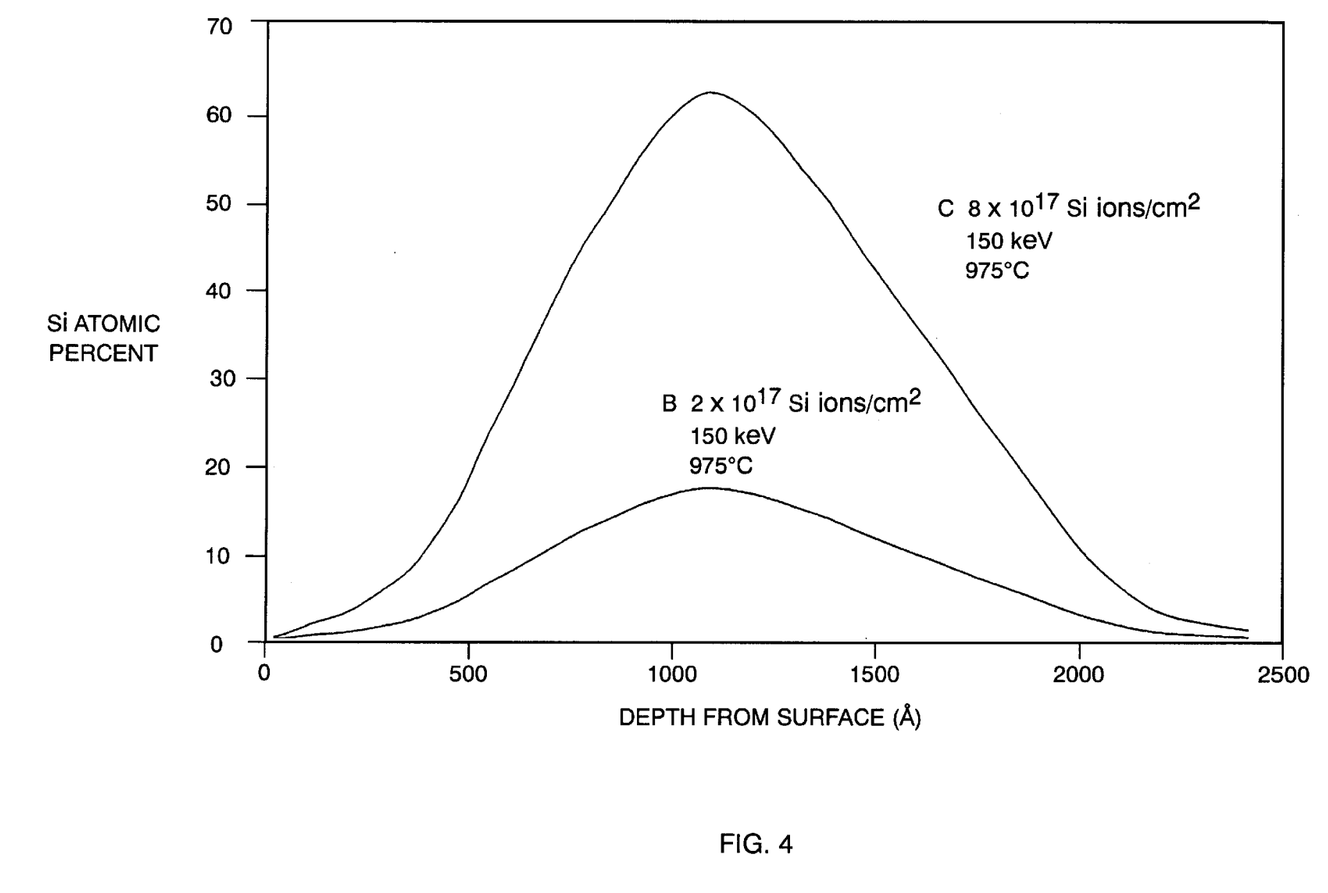
FIG. 4 is a silicon distribution profile determined for the highest-dose silicon implant of FIG. 3.

FIG. 4 shows the estimated profile of the silicon atoms within the ion implanted diamond corresponding to lines B and C of FIG. 3. For line C, a peak silicon concentration of approximately 65 atomic percent is calculated to have occurred at a depth of approximately 0.11 micron below the implanted diamond surface.

Figure 5:
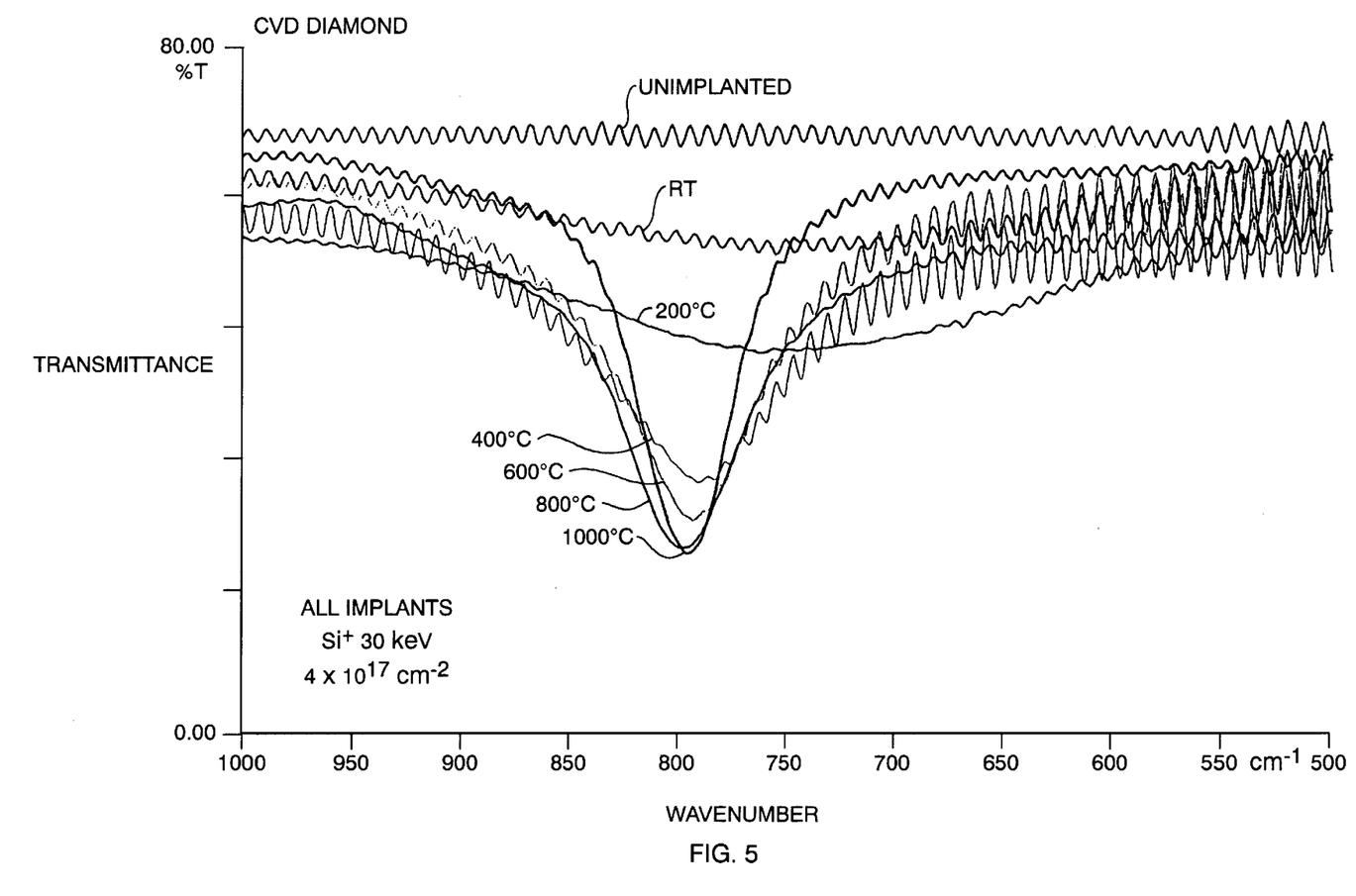
FIG. 5 is a graph of infrared transmittance measurements from vapor deposited diamond windows implanted at various temperatures by silicon ions, illustrating absorption near 800 $cm^{-1}$ which is characteristic of silicon carbide and indicates improving silicon carbide quality with increasing temperature during implantation.

FIG. 5 shows Fourier transform infrared transmittance (FTIR) measurements made on a series of polycrystalline diamond window samples which were grown by chemical vapor deposition. One sample was not implanted and the others were implanted with $4 \times 10^{17}$ ions/cm$^2$ doses of 30 keV silicon ions at temperatures ranging from room temperature (RT) up to 1000° C. The transmittance dip at approximately 800 cm$^{-1}$ wavenumber is characteristic of silicon carbide. The unimplanted diamond sample shows no 800 cm$^{-1}$ transmittance dip. The diamond samples which were implanted at room temperature and at 200° C. show slight transmittance dip behaviors at 800 cm$^{-1}$ indicating weak chemical interaction of the implanted silicon with the diamond. The FTIR spectra from the diamond samples implanted at 400° C. and higher temperatures show sharp 800 cm$^{-1}$ region transmittance decreases which indicate strong chemical interactions of the implanted silicon with the diamond. The FTIR measurements were made using a Perkin-Elmer Model 1615 FTIR Spectrometer.

Figure 6:
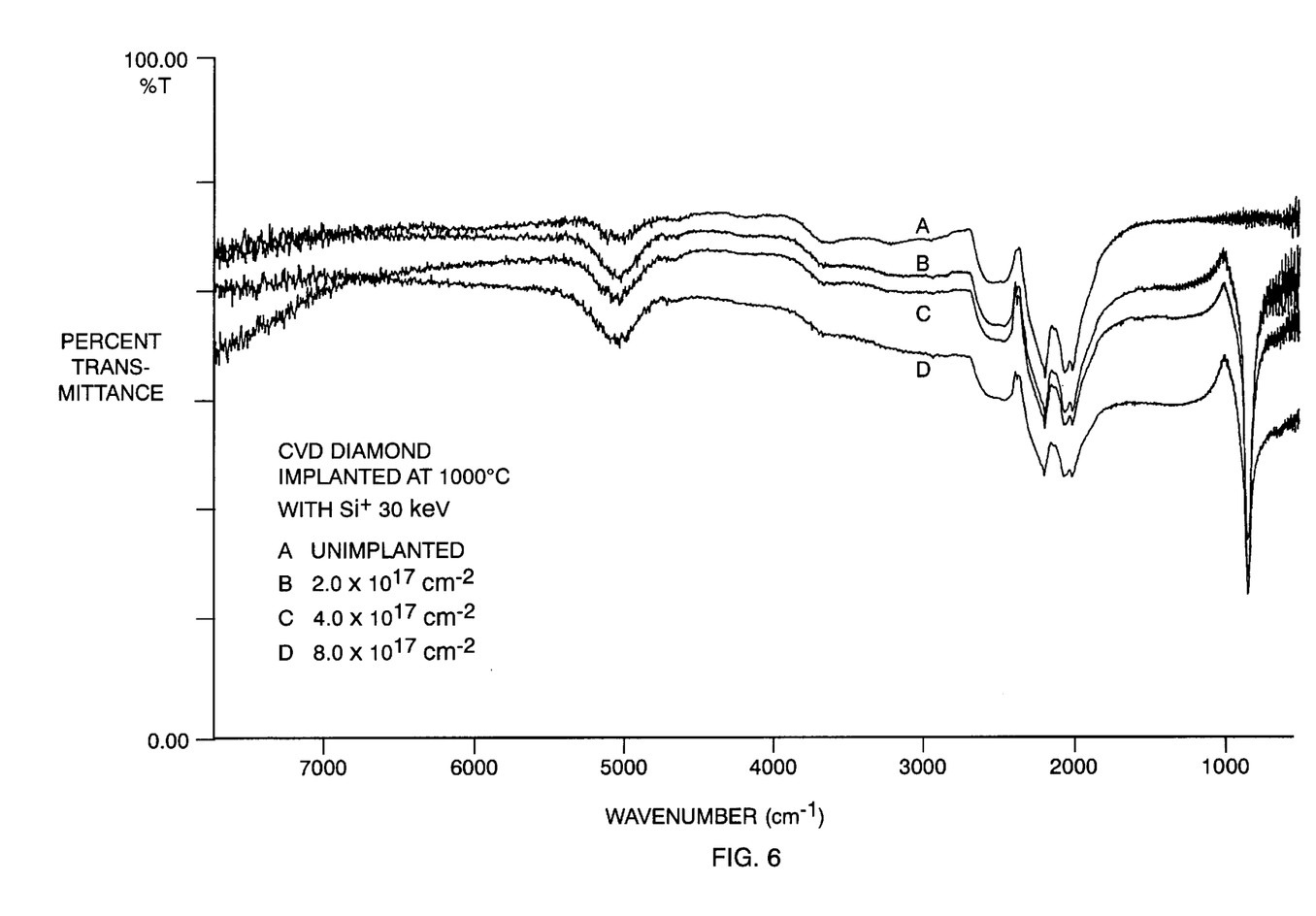
FIG. 6 is a graph of infrared transmittance measurements from vapor deposited diamond windows implanted at 1000° C. by various doses of silicon ions, illustrating the 800 $cm^{-1}$ absorption characteristic of silicon carbide.

FIG. 6 shows FTIR measurements made on another series of polycrystalline diamond windows grown by chemical vapor deposition. One sample was not implanted and the others were implanted at 1000° C. by 30 keV silicon ions to doses of 2, 4 and $8 \times 10^{17}$ ions/cm$^2$. The diamond samples implanted at all of these doses show strong 800 cm$^{-1}$ region transmittance dips indicating silicon carbide layer formation.

Figure 7:
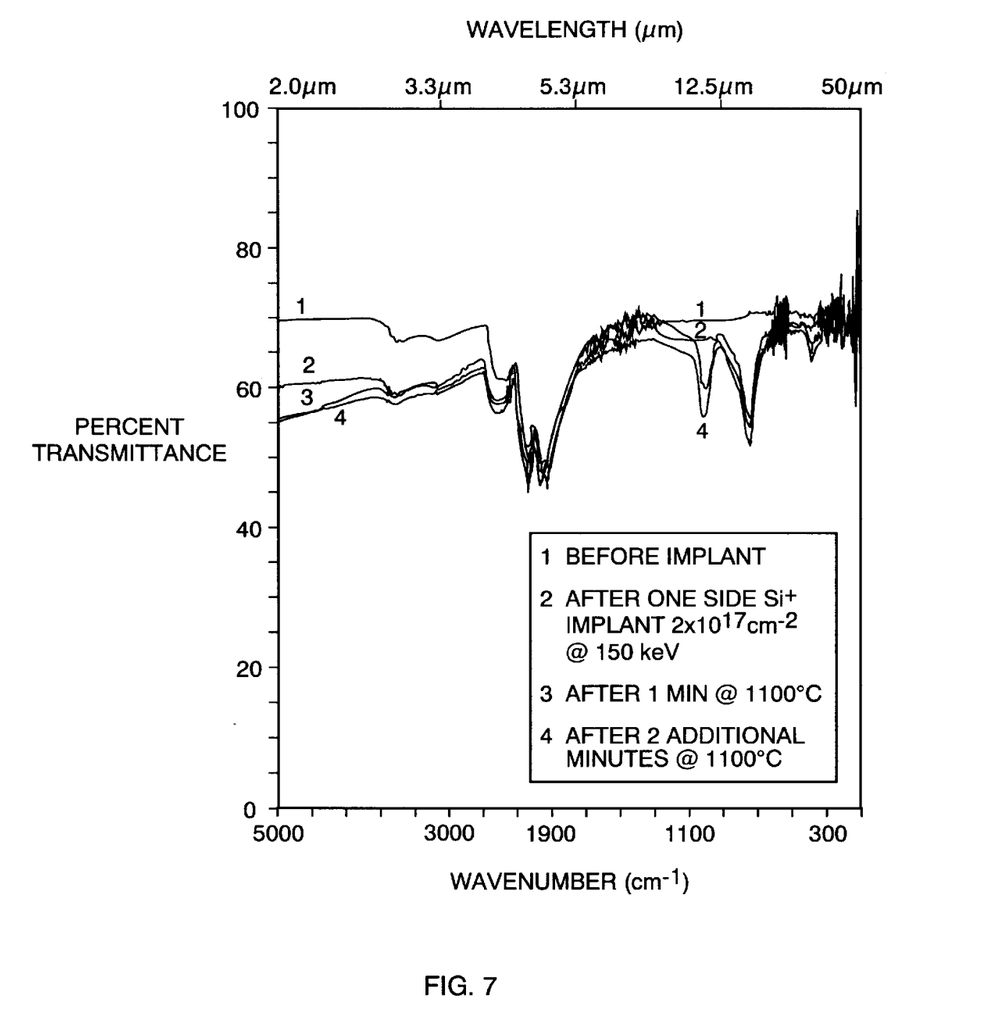
FIG. 7 is a graph of infrared transmittance measurements from a silicon-implanted natural diamond sample which was subjected to oxidations in air at 1100° C.

FIG. 7 shows infrared transmittance measurements made on a natural diamond window sample before ion implantation (line 1), after implantation at 975° C. by 150 keV silicon ions to a dose of $2 \times 10^{17}$ ions/cm$^2$ (line 2) and after subsequent exposures to air while at 1100° C. for 1 minute (line 3) and 2 additional minutes (line 4). The transmittance dip near 800 cm$^{-1}$ wavenumber after implantation (line 2) is indicative of silicon carbide formation. After the oxidation exposures (lines 3 and 4), the 800 cm$^{-1}$ absorption peak characteristic of silicon carbide remains present and an additional absorption peak representative of onset of interaction of the silicon carbide with oxygen can be seen at approximately 1100 cm$^{-1}$ wavenumber. These infrared transmittance measurements were made using a Perkin-Elmer Model 983 Infrared Spectrometer.

Figure 8:
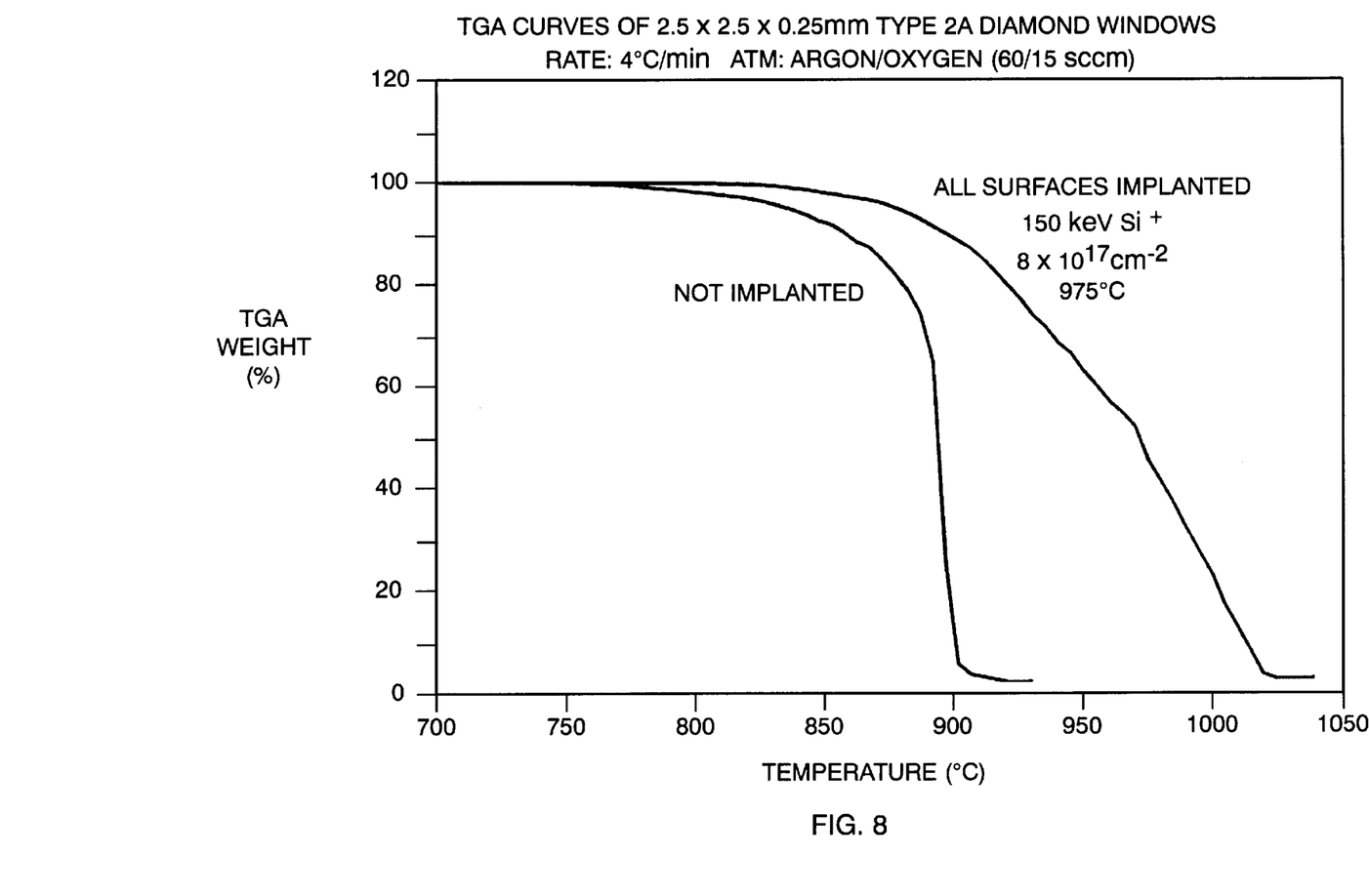
FIG. 8 is a graph of the results of thermogravimetric oxidation analyses of untreated and silicon-implanted natural diamond samples, indicating improvement of the oxidation resistance of the implanted diamond of this invention.

FIG. 8 shows thermogravimetric analyses (TGA) measurements performed on a small unimplanted natural diamond window and on a similar small diamond window which had been implanted at 975° C. with 150 keV silicon ions on all surfaces. The TGA measurements were made using a du Pont Model 951 TGA System with an Ar/O$_2$ atmosphere and a temperature rise rate of 4° C. per minute. Sample weight versus temperature curves are shown in the figure. The unimplanted diamond sample was entirely consumed by oxidation erosion by the time the TGA furnace reached 900° C. In spite of edge discontinuities which existed in the silicon carbide layer due to problems in handling of small samples during implantation and to roughness of the window edges, the implanted diamond window sample was not fully consumed until the furnace reached 1030° C. after a period of more than 30 minutes at temperatures above that at which the unprotected diamond window had already been eliminated.

It is also desirable for some applications to place an optical antireflective layer over diamond windows for missile applications. The overcoatings are typically yttrium oxide, hafnium oxide or other oxides of refractory metals that have sufficient optical characteristics and are stable at high temperatures. However, due to the inert nature of diamond and diamondlike carbon, and to different rates of thermal expansion of the diamond and the coating materials, such deposited coatings have tended to delaminate at elevated temperatures when placed directly on the carbon. This invention contemplates providing an implanted carbide layer having improved adhesion characteristics for such refractory metal oxides as compared to the underlying carbon material. The refractory metal oxide coating can be applied to the adhesion-enhanced item by known deposition techniques.

Although specific features of this invention are shown in some drawings and not in others, this is for convenience only as each feature may be combined with any or all other features in accordance with the invention.

Other embodiments will occur to those skilled in the art and are within the following claims:

What is claimed is:

1. A method of protecting diamond, diamondlike carbon, or other carbon materials from high temperature oxidation, including the steps of:

providing an item of diamond, diamondlike carbon or other carbon materials or of other materials coated by diamond, diamondlike carbon or other carbon materials;

ion implanting said item with ions of a reactive material that reacts with carbon to form a compound that is more oxidation-resistant than the diamond, diamondlike carbon or other carbon material, for introducing said ions into said item; and heating said item during and/or after said exposing step, to react said ions with the carbon of said item and form a layer of said compounds in said item, for oxidation-protecting said item;

wherein said layer of said compound includes, at is maximum, a concentration of said reactive material of at least 10% of the stoichiometric concentration, to create an oxidation-resistant barrier layer which substantially prevents the underlying diamond, diamondlike carbon or other carbon material from oxidizing.

2. The oxidation protection method of claim 1 in which said material reacts with carbon to form a carbide.

3. The oxidation protection method of claim 2 in which said material is silicon.

4. The oxidation protection method of claim 3 in which said item is made of diamond.

5. The oxidation protection method of claim 1 in which said ion is selected from the group of ions consisting of silicon, titanium, tantalum, tungsten, zirconium, vanadium, molybdenum, niobium and boron.

6. The oxidation protection method of claim 1 in which the step of implanting said ions into said item includes providing ions at an energy of 1 keV up to 10 MeV.

7. The oxidation protection method of claim 6 in which said ions are provided at an ion energy of between 5 keV and 400 keV.

8. The oxidation protection method of claim 1 in which the step of implanting said ions into said item includes providing an ion dose of from $10^{15}$ to $10^{19}$ ions per cm$^2$.

9. The oxidation protection method of claim 8 in which said ion dose is from $10^6$ to $3\times10^{18}$ ions per cm$^2$.

10. The oxidation protection method of claim 1 in which the step of heating said item during said ion implanting step includes heating said item to at least 400° C.

11. The oxidation protection method of claim 1 in which the step of ion implanting includes implanting at a dose of at least $10^{17}$ ions per cm$^2$.

12. The oxidation protection method of claim 1 further including depositing on a surface of said item a refractory metal oxide coating to decrease the reflectivity of said item.

13. A method of protecting diamond, diamondlike carbon or other carbon material, or of other materials coated by diamond, diamondlike carbon or other carbon materials, from high-temperature oxidation, including the steps of:

providing an item of diamond, diamondlike carbon or other carbon material, or of other materials coated by diamond, diamondlike carbon or other carbon material;

ion implanting said item with silicon ions at an ion energy of from 5 keV to 400 keV, and an ion dose of $10^{17}$ to $3\times10^{18}$ ions per cm$^2$; and heating said item, during and/or after said ion implanting step, to at least 400° C., to form a silicon carbide layer in said item having a maximum silicon concentration of at least 10% of the stoichiometric silicon concentration in silicon carbide, to create an oxidation-resistant silicon carbide layer which substantially prevents the underlying diamond, diamondlike carbon or other carbon material from oxidizing, for protecting said item from high temperature oxidation.

* * * * *